US008068357B2

(12) United States Patent
Ware et al.

(10) Patent No.: US 8,068,357 B2
(45) Date of Patent: Nov. 29, 2011

(54) MEMORY CONTROLLER WITH MULTI-MODAL REFERENCE PAD

(75) Inventors: Frederick Ware, Los Altos Hills, CA (US); John Wilson, Raleigh, NC (US); John C. Eble, III, Chapel Hill, NC (US); Jade M. Kizer, Durham, NC (US); Lei Luo, Durham, NC (US); John W. Poulton, Chapel Hill, NC (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 524 days.

(21) Appl. No.: 12/204,728

(22) Filed: Sep. 4, 2008

(65) Prior Publication Data

US 2009/0059642 A1 Mar. 5, 2009

Related U.S. Application Data

(60) Provisional application No. 60/967,720, filed on Sep. 5, 2007.

(51) Int. Cl.
*G11C 5/06* (2006.01)

(52) U.S. Cl. ............... 365/63; 365/189.07; 365/189.09; 365/189.03

(58) Field of Classification Search .......... 365/63, 365/189.07, 189.09, 189.03
See application file for complete search history.

(56) References Cited

U.S. PATENT DOCUMENTS

| | | | |
|---|---|---|---|
| 6,310,796 B1 | 10/2001 | Song | 365/63 |
| 6,513,081 B2 | 1/2003 | Farmwald | 710/107 |
| 6,546,343 B1 | 4/2003 | Batra et al. | 702/64 |
| 6,675,272 B2 | 1/2004 | Ware et al. | 711/167 |
| 6,707,724 B2 | 3/2004 | Kim et al. | 365/189.09 |
| 6,859,067 B2 * | 2/2005 | Yamamoto | 326/80 |
| 6,870,783 B2 * | 3/2005 | Kwak et al. | 365/201 |
| 7,133,945 B2 | 11/2006 | Lau | 710/104 |
| 7,162,376 B2 | 1/2007 | Oh | 702/57 |
| 7,489,153 B2 * | 2/2009 | Spirkl | 324/750.3 |
| 2005/0240744 A1 | 10/2005 | Shaikh et al. | |
| 2007/0283076 A1 * | 12/2007 | Kim et al. | 710/315 |

OTHER PUBLICATIONS

Poulton, John., "Signaling in High Performance Memory Systems", IEEE Solid State Circuits Conference, slides 1-59 on 30 pages (Feb. 1999).
Micron, "Graphics DDR3 DRAM." Advance. "256 Mb×32 GDR3 DRAM." © 2003 Micron Technology, Inc. pp. 1-66.
Janzen, Jeff, "DDR2 Offers New Features and Functionality," Designline, vol. 12, Issue 2, Micron, 16 pages, Jul. 31, 2003 EN.L.
Samsung, "512Mb E-die DDR3 SDRAM Specification", Preliminary Specification, Rev. 0.5, Dec. 2006, 55 pages.
Samsung, DDR3 SDRAM Specification. Rev. 0.1, Jan. 2007, Unbuffered DIMM, 59 pages.

(Continued)

*Primary Examiner* — Connie Yoha
(74) *Attorney, Agent, or Firm* — Silicon Edge Law Group Law; Arthur J. Behiel (57) ABSTRACT

A memory controller operates in two modes to support different types of memory devices. In a first mode, the memory controller distributes a dedicated reference voltage with each of a plurality of signal bundles to a corresponding plurality of memory devices. The reference voltages are conveyed using pads that are alternatively used for e.g. timing-reference signals in a second mode, so the provision for bundle-specific reference voltages need not increase the number of pads on the memory controller.

55 Claims, 6 Drawing Sheets

OTHER PUBLICATIONS

Samsung, DDR3 SDRAM Specification; Rev. 0.0, 66 pages, Jan. 2007, DDR3 SDRAM Device Operation.
Micron (Advance), 1Gb DDR3 SDRAM, MT41J256M4—32 Meg×4×8 banks, MT41J128M8—16 Meg×8×8 banks, MT41J64M16—8 Meg×16×8 banks; 2006, 15 pgs.
Micron, DDR2 SDRAM SODIMM, MT16HTF6464H—512MB, MT16HTF12864H—1GB, MT16HTF25664H—2GB, 2004-2005, 22 pgs. Rev. A 1/06 EN.
Samsung, DDR2 SDRAM, Device Operating & Timing Diagram, 44 pgs., May 2007.
Samsungn, 512Mbit GDDR4 SGRAM Revision 1.0 Jun. 2006, 70 pages.
Hynix, Preliminar 240pin DDRS SDRAM Unbuffered DIMMS, Revision 0.02, Feb. 2007, 53 pages.
Lattice Semiconductor Corporation, Differential Signaling, Application Note AN6019. May 2001. 4 pages.
Samsung, 512Mbit GDDR3 SDRAM, Revision 1.5, Jun. 2006. 59 pages.
Dally, William J. and Poulton, John W., Digital Systems Engineering, Publishing page and pp. 314-352, first printed in 1998.

* cited by examiner

MEMORY CONTROLLER WITH MULTI-MODAL REFERENCE PAD

FIELD

The subject matter disclosed herein relates generally to the field of communications, and more particularly to high speed electronic signaling within and between integrated circuit devices.

BACKGROUND

Electronic signaling systems are commonly "single-ended" or "differential." Single-ended systems represent data as a varying voltage on a single conductor, whereas differential systems transmit information as complementary signals on separate conductors. Differential signaling is more noise tolerant, and can thus support higher speed performance, than single-ended signaling. The main advantage of single-ended over differential signaling is that fewer conductors are needed to transmit multiple signals.

The density of integrated circuits (ICs) has risen markedly faster than the number of pads available to convey external signals. As a result, many ICs are pad limited, which is to say that the area and cost of ICs are largely determined by the requisite number of external signaling pads. Single-ended signaling requires fewer pads and is therefore desirable for many pad-limited applications. Single-ended signaling is also desirable for many applications in which circuit-board routing space is limited.

The superior noise tolerance of differential signals is due in part to the fact that two signal halves are measured relative to one another so that noise common to both signals can be rejected. In a single-ended system, the value of a measured signal depends upon a reference voltage, typically ground, within a system. Reference voltages can be generated locally, possibly in the vicinity of the receiver, but such reference voltages do not carry the same dynamic noise that distorts the information signal. This is particularly true where single-ended signals that share a common reference voltage are conveyed on separate channels and are therefore subject to disparate noise environments. The generation and delivery of reference voltages must therefore be carefully considered when implementing a high-performance single-ended signaling system.

Some systems improve the performance of single-ended systems by conveying a suitable reference voltage with bundles of signal wires. Noise and channel effects that impact the signal wires similarly impact the reference voltage and thus tend to cancel at the receiver. Unfortunately, provisioning for each additional reference voltage increases the requisite number of pads: as noted above, a lower pad count is often the reason for using single-ended signaling in the first place.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
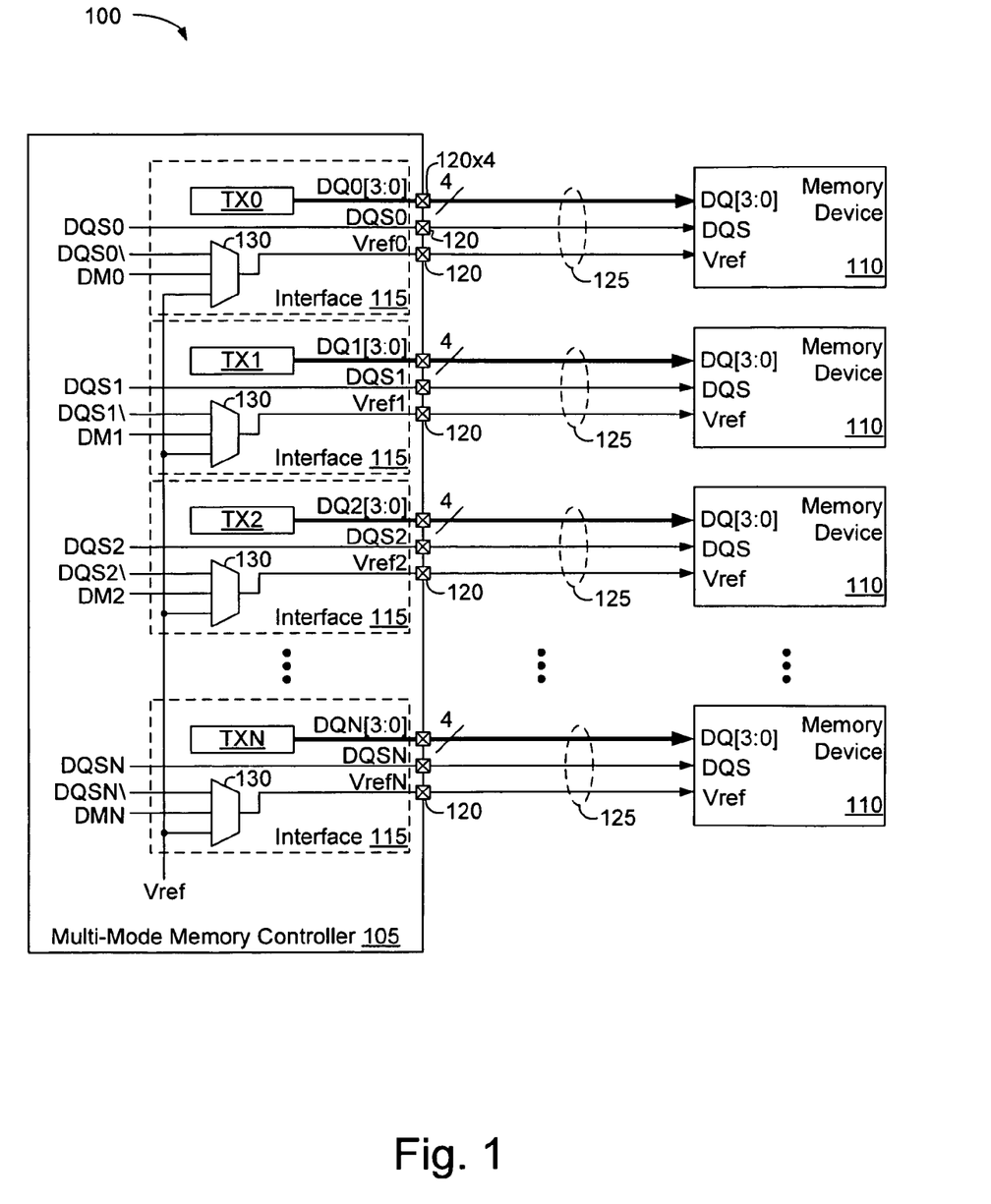
FIG. 1 depicts a memory system 100 in accordance with an embodiment in which a memory controller 105 distributes a dedicated reference voltage with each of N+1 bundles of single-ended signals to a corresponding N+1 memory devices 110.

FIG. 1 depicts a memory system 100 in accordance with an embodiment in which a memory controller 105 distributes a dedicated reference voltage with each of N+1 bundles of single-ended signals to a corresponding N+1 memory devices 110. The reference voltages are conveyed using pads that are alternatively used for other signals, so the provision for bundle-specific reference voltages does not increase the number of pads on memory controller 105.

Memory controller 105 includes N+1 interfaces 115, each of which communicates six signals from a signal-bundle port to a respective one of memory devices 110 via pads 120 and a corresponding channel 125. With reference to the topmost interface 115, for example, that circuitry transmits four data signals DQ0[3:0], a timing reference signal DQS0, and a reference voltage Vref0 to the topmost memory device 110. In particular, a transmitter TX0 transmits four data signals DQ0[3:0] via respective data pads of the six pads 120; a data strobe source (not shown) transmits a timing reference signal DQS0 over a fifth of pads 120; and a reference source 130, an analog multiplexer in this embodiment, couples a reference-voltage node Vref to a multi-modal one of the sixth of pads 120 to convey a reference voltage Vref0 specific to the topmost memory device 110. Noise that impacts the signals on lines DQ0[3:0] equally impacts reference voltage Vref0, so the effects of the noise tend to cancel at memory device 110.

Reference source 130 conveys reference voltages in the depicted operational mode, but controller 105 supports two alternative modes. In the first, reference source 130 conveys a second timing reference—a strobe DQS0\ complementary to strobe DQS0—that may be used should memory controller 105 be employed in connection with memory devices that accept or require complementary strobe signals. In the second alternative mode, reference source 130 conveys a data-mask signal DM0 supported by some memory devices (e.g., double data-rate memory). In either alternative mode, the memory device or devices can employ an alternate source for a reference voltage. Memory controller 105 thus supports a multi-modal pad to communicate reference voltages without the need for additional pads. Reference source 130 selects from among three signals in this example, but can select between more, fewer, or different signals in other embodiments.

Mode selection for reference source 130 can be carried out using e.g. registers, jumper settings, fuses, anti-fuses, or other forms of volatile or non-volatile memory. The signal bundles are six-wide in this example, but other widths might also be used. Furthermore, two or more signal bundles can share a multi-modal pad in other embodiments. Also, the multi-mode references can be instantiated on one or more memory devices in lieu of or in addition to on one or more memory controllers.

Memory systems that may benefit from the use of multi-modal pads may be implemented using e.g. static, dynamic, volatile, or non-volatile memories. Typical examples include single- and double-data-rate dynamic random-access memory (DRAM), static random-access memory (SRAM), and flash memory. Such memory systems have broad application in e.g. computer main memory, graphics, mobile telephones, and gaming consoles.

Figure 2:
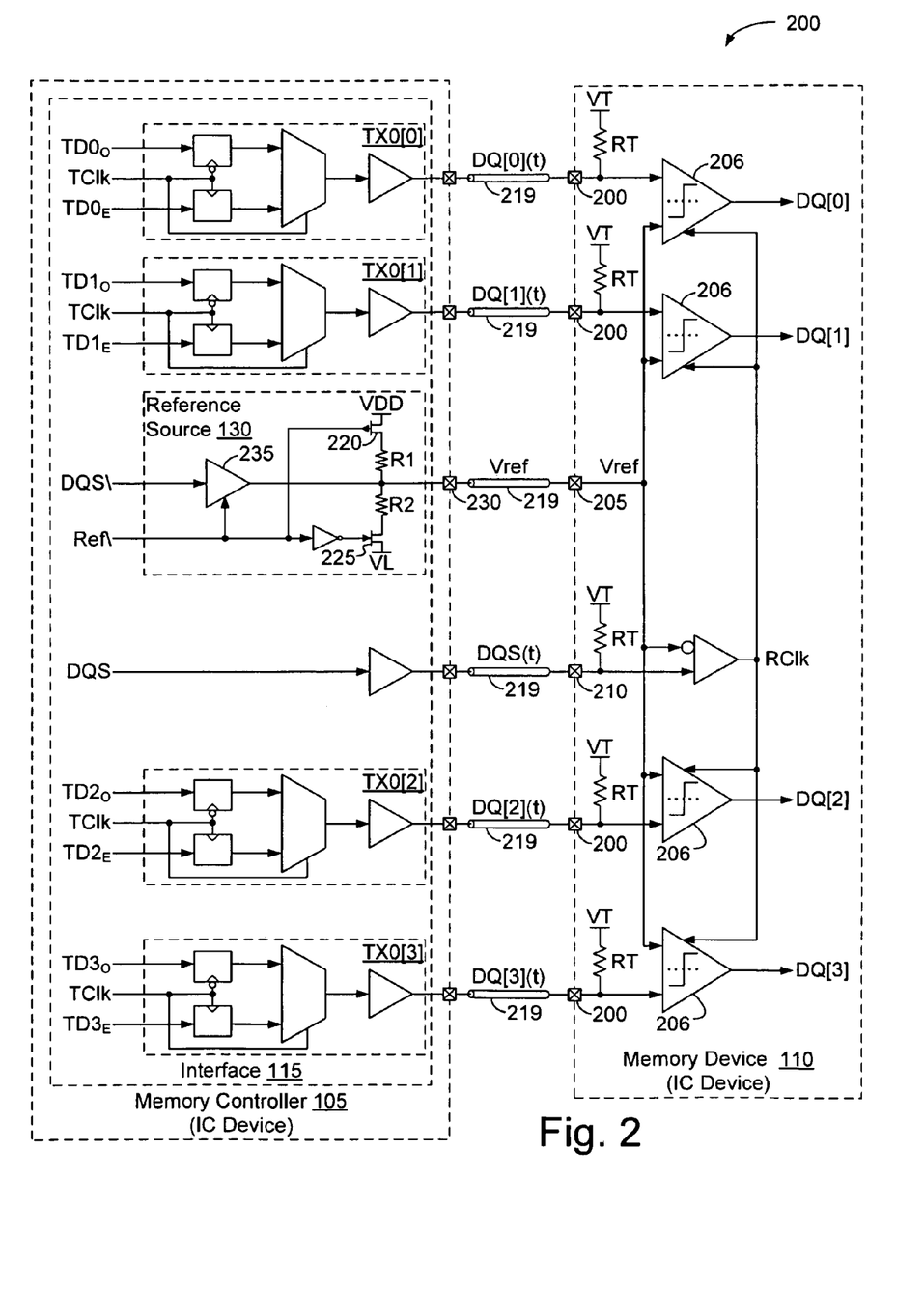
FIG. 2 details a portion of memory system 100 of FIG. 1 in an operational mode in which memory controller 105 distributes reference voltages on a multi-modal pad 230.

FIG. 2 details a portion of memory system 100 of FIG. 1, like-labeled elements being the same or similar. FIG. 2 omits all but one interface 115 and a corresponding memory device 110 for ease of illustration. Memory device 110 is coupled to interface 115 via a receive port that includes four data pads 200, a voltage-reference pad 205, and a timing-reference pad 210.

Four-bit transmitter TX0, a double-data rate (DDR) transmitter in this example, is divided into four single-bit transmitters TX0[3:0], each of which combines odd and even data into a serial bitstream. For example, transmitter TX0[0] combines odd and even signals $TD0_O$ and $TD0_E$ into a continuous-time data stream DQ0[0](t) in which the odd and even symbols are timed to opposite edges of a transmit clock signal TClk. Memory device 110 terminates each conductor 219 using a suitable termination voltage VT and termination resistance RT. A sampler 206 in memory device 110 samples signal DQ0[0](t) on edges of a receive clock signal RClk to recover discrete data signal DQ[0]. Memory device 110 derives receive clock signal RClk from a timing reference DQS from memory controller 105. Different methods of synchronizing the transmission and receipt of data may also be used, as will be evident to those of skill in the art.

Conductors 219 communicate data and reference signals from memory controller 105 to memory devices 110. Some or all of these lines can communicate in the opposite direction, or can be bidirectional. For example, each of transmitters TX0[3:0] can instead be another form of data-communication circuit, such as a receiver or a transceiver. Likewise, samplers 206 are part of a multi-input receiver in this example, but memory device 110 may include a transmitter instead of or in addition to the receiver. Reference source 130 alternatively provides strobe signal DQS\ or reference voltage Vref on a multi-modal pad 230, and may additionally provide e.g. a data mask signal DM as shown in FIG. 1.

Sampler 206 interprets signal DQ[0](t) relative to a reference voltage Vref from interface 115. When a control signal Ref\ is asserted (set to logic zero), reference source 130 enables a pair of transistors 220 and 225, and thus couples multi-modal pad 230 to respective high and low voltages VDD and VL via a pair of resistors R1 and R2. The voltages VDD/VL and resistance values of resistors R1 and R2 are selected such that multi-modal pad 230 is set to the desired reference voltage level Vref. Asserting Ref\ additionally disables an amplifier 235 to block complementary strobe signal DQS\. The remaining transmitter/receiver pairs work the same way, so a detailed discussion is omitted for brevity.

In addition to setting a desired voltage level, the output resistance of the network formed by transistors 220/225 and resistors R1/R2 may be matched to the characteristic impedance of the channel formed by the one of conductors 219 that extends from pad 230. The output resistance and voltage of source 130 can be established using different types of circuitry in other embodiments. For example, transistors 220 and 225 can be positioned between pad 230 and their respective resistors R1 and R2, or the pull-up and pull-down components of source 130 can be "legs" of output driver 235 that are statically enabled when signal Ref\ is asserted.

Figure 3:
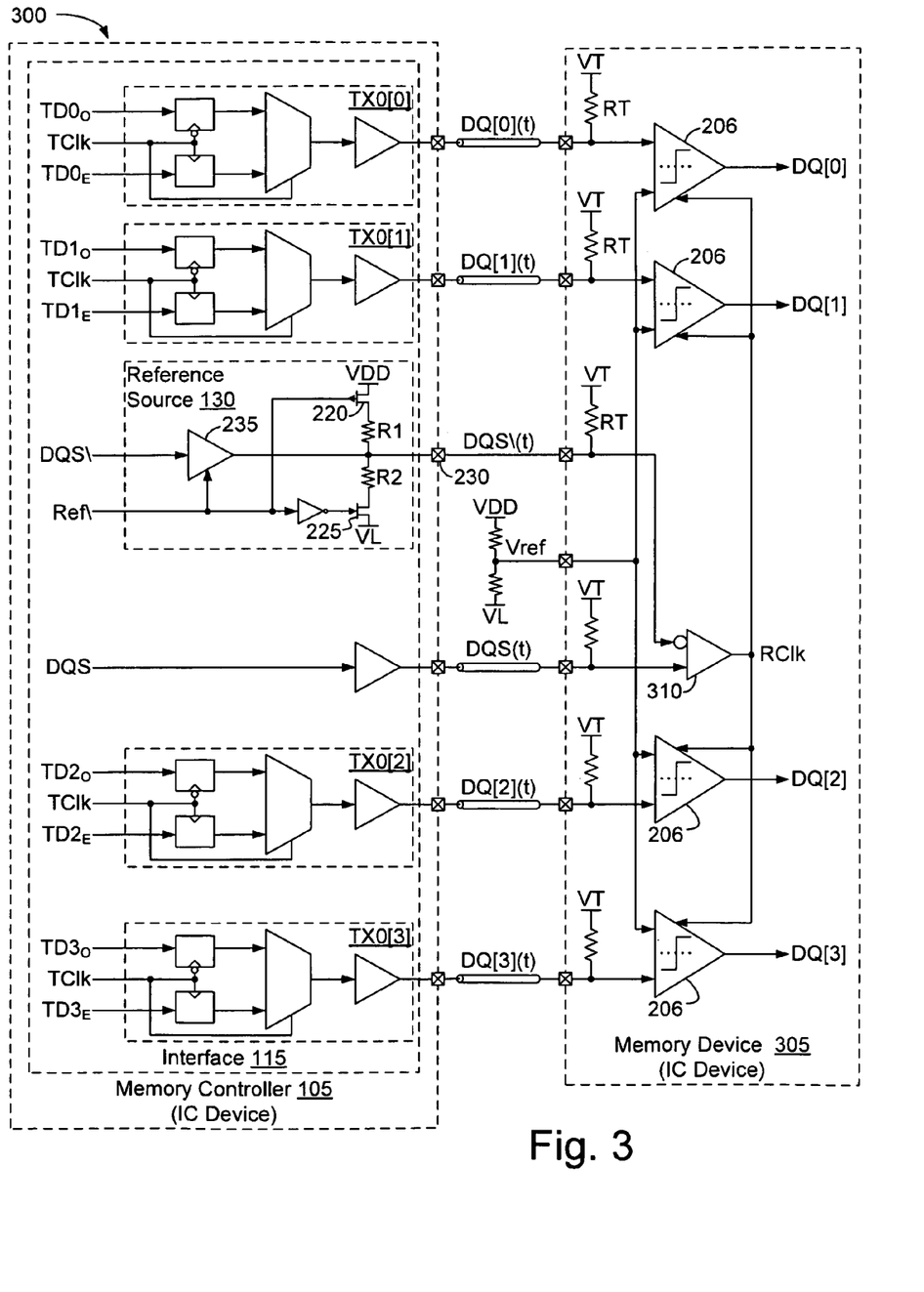
FIG. 3 details a portion of a memory system in an operational mode in which memory controller 105 distributes a timing reference on a multi-modal pad 230.

FIG. 3 details a memory system 300 similar to the portion depicted in FIG. 2. In this example, however, memory controller 105 is configured in a second operational mode to meet the requirements of a memory device 305 that receives complementary strobe signals DQS and DQS\, and that employs a locally generated reference voltage Vref.

As in the example of FIG. 2, sampler 206 interprets signal DQ[0](t) with reference to reference voltage Vref. In this example, however, the reference voltage is developed using a reference-voltage source outside of memory controller 105, e.g. via a resistor network external to controller 105 and memory device 305 or a voltage reference within memory device 305. Signal Ref\ is de-asserted (set to logic one) to disable transistors 220 and 225 and enable amplifier 235. Reference source 130 thus couples complementary strobe signal DQS\ to multi-modal pad 230. Clock recovery circuitry 310 in memory device 305 thus receives both complementary strobe signals DQS and DQS\. As noted above in connection with FIG. 1, reference source 130 can support additional modes (e.g., a data-mask mode), but the embodiments of FIGS. 2 and 3 are bimodal for ease of illustration.

Figure 4:
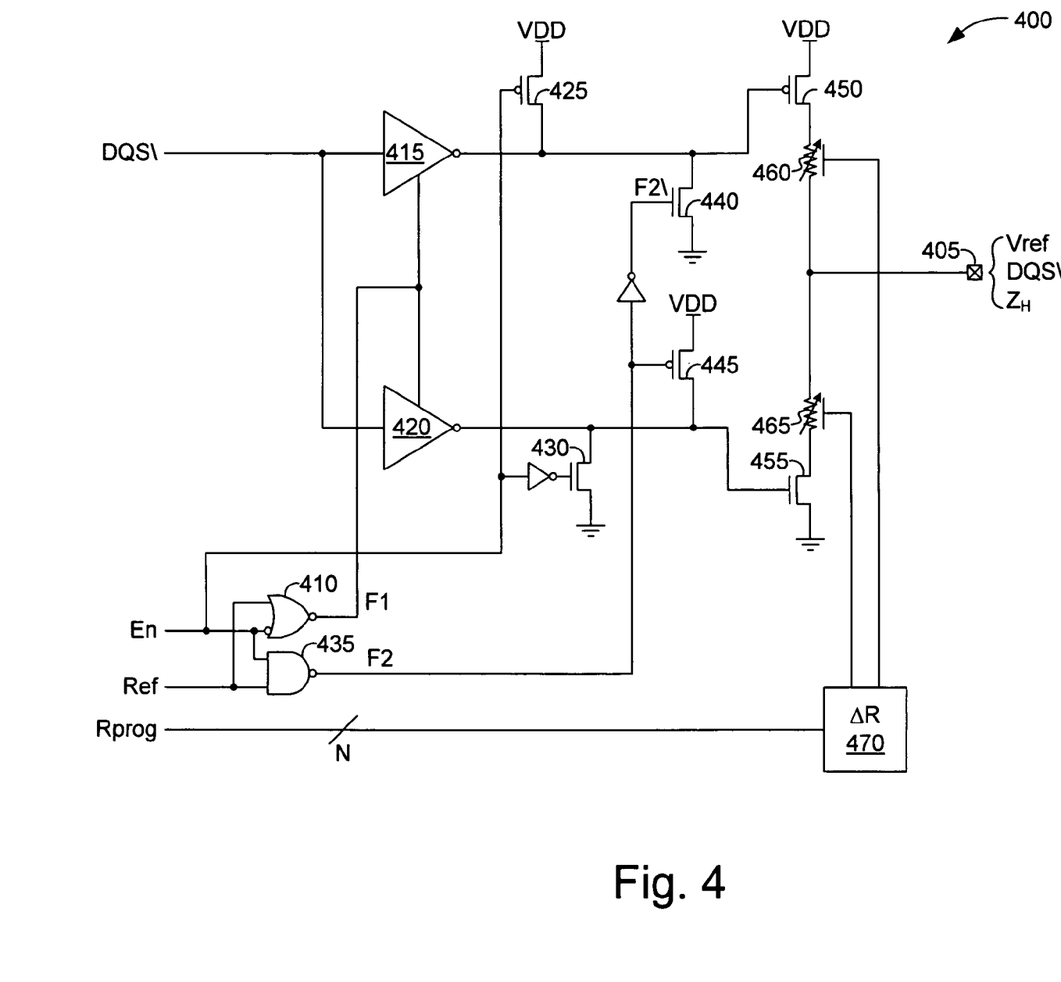
FIG. 4 depicts a multi-modal reference source 400 in accordance with another embodiment.

FIG. 4 depicts a multi-modal reference source 400 in accordance with another embodiment. Reference source 400 alternatively conveys a reference voltage Vref, transmits a timing reference DQS\, or exhibits a high impedance $Z_H$ on a multi-modal pad 405.

Reference source 400 enters the high-impedance mode when an enable signal En is de-asserted (set to zero). De-asserting signal En:
1. causes an output F1 of a NOR gate 410 to go low, which disables each of a pair of inverting amplifiers 415 and 420;
2. enables a pair of transistors 425 and 430, which pull the outputs of amplifiers 415 and 420 to supply voltages VDD and ground, respectively; and
3. causes an output F2 of a NAND gate 435 to go high, which disables a second pair of transistors 440 and 445.

The resulting high and low voltages on the respective outputs of amplifiers 415 and 420 disable each of a third pair of transistors 450 and 455, and thus provides a high impedance on pad 405.

Reference source 400 transmits timing reference DQS\ when enable signal En is asserted and a signal Ref is de-asserted. With these control signals,
1. output F1 of NOR gate 410 goes high, which enables amplifiers 415 and 420;
2. transistors 425 and 430 are disabled; and
3. output F2 of a NAND gate 435 goes high, which disables transistors 440 and 445.

Thus configured, amplifiers 415 and 420 each present an inverted version of signal DQS\ to a respective one of transistors 450 and 455. Transistors 450 and 455 invert their respective input signals, and thus transmit signal DQS\ on pad 405 via a pair of termination resistors 460 and 465.

Termination resistors 460 and 465 are programmable in the depicted example. A register 470 stores calibration signals Rprog and applies them to digital control ports on the termination resistors. Various methods and circuits for calibrating termination resistors are well known to those of skill in the art. A detailed discussion of such methods and circuits are omitted for brevity.

Reference source 400 provides a voltage reference Vref when signals En and Ref are both asserted. In this mode,
1. output F1 of NOR gate 410 to goes low, which disables amplifiers 415 and 420;
2. transistors 425 and 430 are disabled; and
3. output F2 of a NAND gate 435 goes low, which enables transistors 440 and 445.

Thus configured, transistors 450 and 455 are enabled so that that path between supply nodes VDD and ground through resistors 460 and 465 forms a simple DC voltage divider that exhibits a reference voltage Vref on pad 405. In one embodiment resistors 460 and 465 are of equal resistances and voltage Vref is half of supply voltage VDD. The values of resistors 460 and 465 are equal and remain the same in each alternative mode. In other embodiments, however, the values of resistors 460 and 465 can differ, and can be different in different modes.

Figure 5:
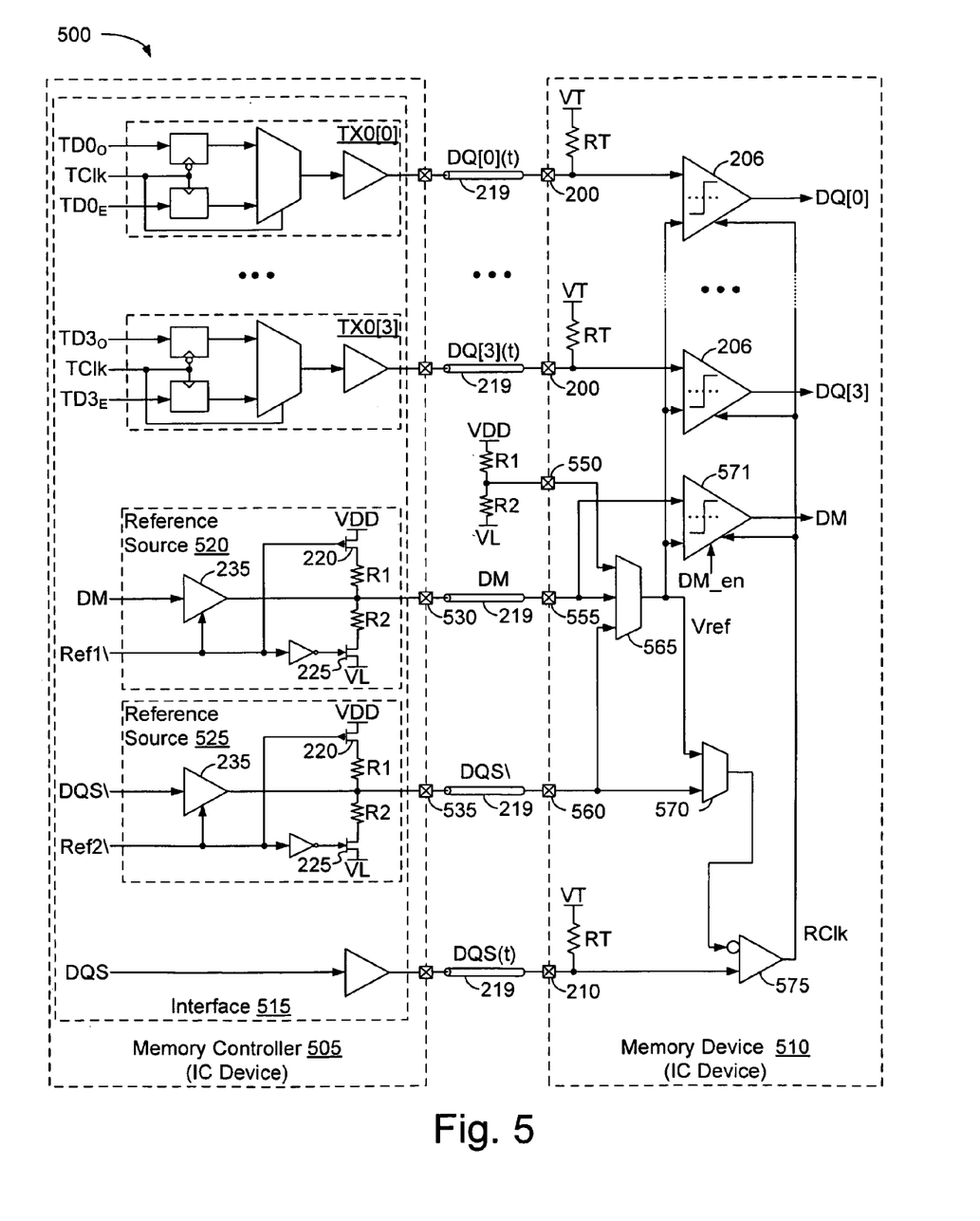
FIG. 5 depicts a system 500 that includes a memory controller 505 and a memory device 510 that can be used separately or together in other embodiments.

FIG. 5 depicts a system 500 that includes a memory controller 505 and a memory device 510 that can be used separately or together in accordance with other embodiments. System 500 may be in some ways similar to system 200 of FIG. 2: a detailed discussion of like-labeled elements is omitted for brevity.

Memory controller 505 includes an interface 515 with two reference sources 520 and 525 and corresponding multi-modal pads 530 and 535. When a signal Ref1\ is asserted (de-asserted), reference source 520 provides a reference voltage (data mask signal DM) on pad 530. When a signal Ref2\ is asserted (de-asserted), reference source 525 provides a reference voltage (a strobe signal DQS\) on pad 535. Memory controller 505 can thus be used in conjunction with memory devices that require both a data mask signal DM and a strobe signal DQS\, and can deliver a reference voltage on either of two multi-modal pads while delivering either a data mask or a strobe signal on the other multi-modal pad. Reference sources 520 and 525 are similar to reference source 130 of FIGS. 1-3, so a detailed discussion is omitted here for brevity.

Memory device 510 includes pads 550, 555, and 560 connected to the input terminals of a pair of analog multiplexers 565 and 570. Multiplexer 565 can provide a reference voltage Vref to samplers 206 by selectively coupling the reference-voltage input nodes of the sampler to one of pads 550, 555, and 560. If pad 560 is used to convey strobe signal DQS\, then multiplexer 570 can convey strobe signal DQS\ to one input terminal of a differential clock receiver 575 to develop, with a complementary strobe signal DQS, a receive clock signal RClk. Multiplexer 570 can alternatively provide voltage Vref to clock receiver 575. Pad 550 may be tied to an external reference source, such as the depicted voltage divider. Multiplexer 565 may select an internally generated reference voltage instead of or in addition to the one provided on pad 550. Because memory device 510 can accept a reference voltage from any of pads 550, 555, and 560, memory controller 505 may contain one, neither, or both of reference sources 520 and 525. References that lack one or both of the reference sources may nevertheless include one or both of pads 530 and 535 and the requisite circuitry to convey data-mask and strobe signals. In this example, pad 555 is connected to an input of a sampler 571, which may be enabled for use with data-mask signal DM by asserting an enable signal DM_en.

In other embodiments memory device 510 lacks one or both of multiplexers 565 and 570 and the requisite connectivity is provided by hard-wired or programmable interconnections between memory controller 505 and memory device 510. For example, node Vref on memory device 510 can be hard-wired to a multi-modal pad on an associated memory controller.

Figure 6:
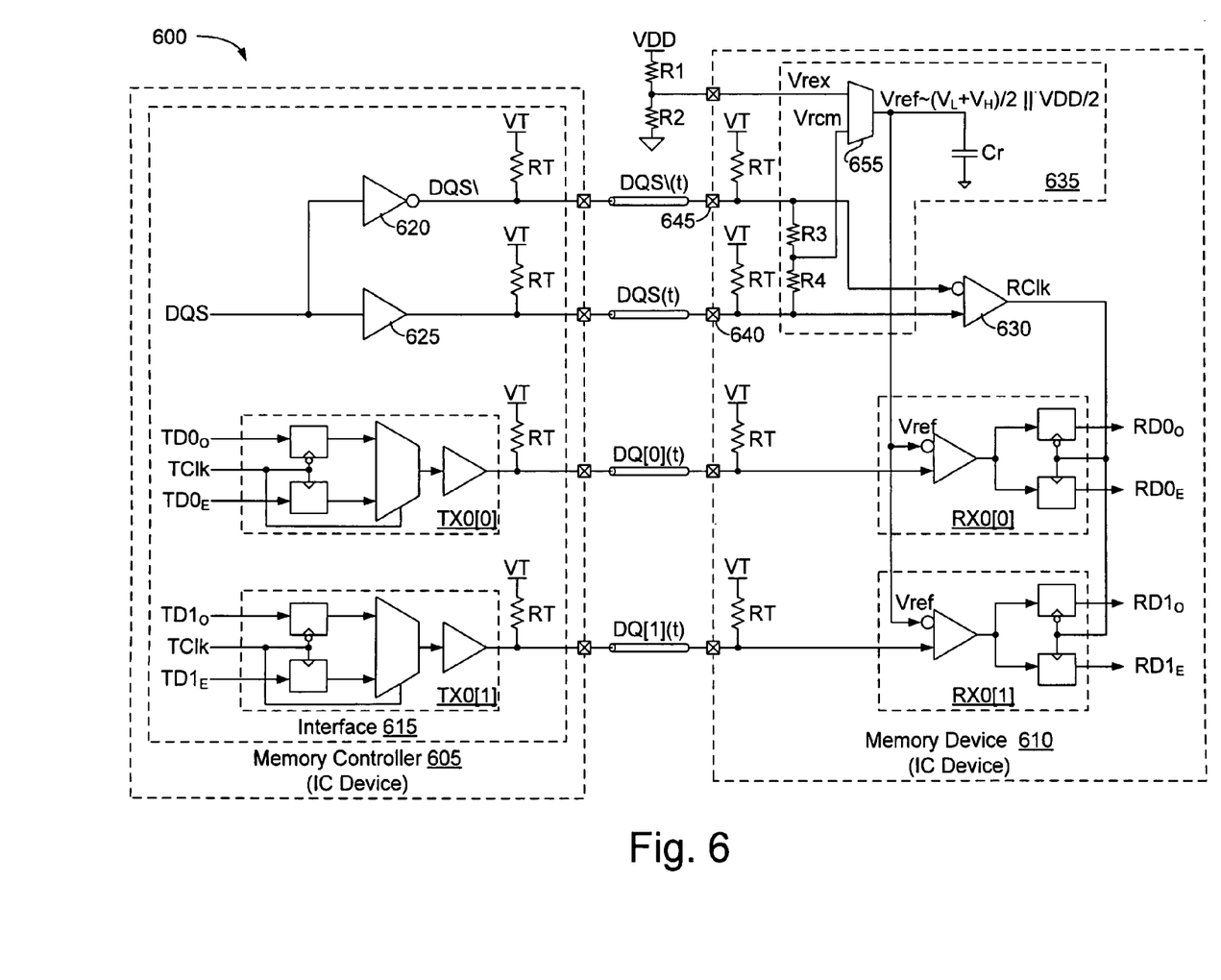
FIG. 6 depicts a memory system 600 that includes a memory controller 605 and a memory device 610 similar to controller 105 and device 110 of FIGS. 1-3.

FIG. 6 depicts a memory system 600 that includes a memory controller 605 and a memory device 610 similar to controller 105 and device 110 of FIGS. 1-3, with like-identified elements being the same or similar. A number of elements are omitted for brevity. Memory controller 615 includes at least one memory interface 615, which in turn includes a pair of transmitters TX0[1:0] and inverting and non-inverting strobe buffers 620 and 625. Device 610 includes a corresponding pair of receivers RX0[1:0], a differential timing-reference receiver 630, and a common-mode-extraction and reference circuit 635. Receiver 630 is a simple differential receiver in this example, but many other types of clock receivers are available and might also be used.

Interface 615 conveys complementary strobe signals DQS and DQS\ to memory device 610 as differential signals DQS(t) and DQS\(t) on respective timing-reference pads 640 and 645, and ultimately to the differential input nodes of amplifier 630, which serves as a timing-reference receiver in this embodiment to recover a receive clock signal RClk. Each of receivers RX0[1:0], which are double-data-rate (DDR) receivers in this embodiment, includes complementary sequential storage elements that sample incoming signals on respective rising and falling edges of clock signal RClk. Signal RClk can be a clock or strobe signal, and may be derived from the complementary timing-reference signals from IC 605 by phase aligning the timing-reference signals with a reference clock signal (not shown). Receivers RX0[1:0] can be implemented in many ways that are well understood by those of skill in the art. A detailed discussion of these and other elements is omitted for brevity. Other timing-reference signals, such as clock signals, can be used in lieu of strobe signals DQS and DQS\ in other embodiments.

Each of receivers RX0[1:0] interprets its respective data signal DQ[#](t) with reference to a reference voltage Vref that, in accordance with the depicted embodiment, can be sourced externally or can be conveyed from interface 615. Amplifier 630 may be similarly adapted to employ a reference voltage in lieu of differential input signals. Common-mode-extraction and reference circuit 635 includes a pair of resistors R3 and R4 connected in series between timing-reference pads 640 and 645, a multiplexer 655 having a first input node coupled between resistors R3 and R4 and a second input node coupled between a pair of external resistors R1 and R2, and an output node connected both to a capacitor Cr and the reference-voltage terminals of receivers RX0[1:0].

In a first mode, multiplexer 655, an analog multiplexer, selects its upper input to couple the terminal Vrex common to resistors R1 and R2 to output node Vref. In this case resistors R1 and R2 are equal, so reference voltage Vref is VDD/2. In a second mode, multiplexer 655 selects its lower input to couple the terminal Vrcm common to resistors R3 and R4 to output node Vref. In this case resistors R3 and R4 are equal, so reference voltage Vref is $(V_L+V_H)/2$, where $V_L$ and $V_H$ are the voltages used to express a logic zero and a logic one between pads 640 and 645. This second mode advantageously allows for simultaneous transmission of complementary timing-reference signals and a reference voltage with noise characteristics shared by other signals in the system without requiring an additional transmitter, receiver, and channel for the reference signal. Capacitor Cr acts as a filter in either mode to stabilize reference voltage Vref.

The common-mode extraction detailed above uses resistors R3 and R4 and capacitor Cr, the values of which would be readily determined by those of skill in the art based on the requirements and specifications of system 600. Alternate methods, not described herein, could be used to extract the common-mode voltage (or reference voltage) from clock or strobe signals using active circuits, and could easily be implemented by those of skill in the art.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Further, uni-directional signal paths can be bidirectional.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

The present invention is not limited to the embodiments detailed above. Other examples can include multi-modal memory devices instead of or in addition to a multi-modal controller. In such embodiments one or more memory devices can transmit alternative signals to a memory controller. Still other embodiments can support multi-modal pads in which the modes can be changed during system operation. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Yet more variations will be obvious to those of ordinary skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. An integrated circuit comprising:
   a. a plurality of pads, including data pads and a multi-modal pad;
   b. a plurality of data-communication circuits, each data-communication circuit coupled to one of the data pads; and
   c. a reference source coupled to the multi-modal pad, the reference source operable in a reference-voltage mode to provide a reference-voltage signal on the multi-modal pad and in a second mode to provide a second signal on the multi-modal pad.

2. The integrated circuit of claim 1, wherein the second signal is a timing-reference signal.

3. The integrated circuit of claim 1, wherein the second signal is a strobe signal.

4. The integrated circuit of claim 1, further comprising a timing-reference source coupled to a timing-reference pad, the timing-reference source to provide a timing-reference signal on the timing-reference pad.

5. The integrated circuit of claim 4, wherein the second signal is a second timing-reference signal complementary to the first-mentioned timing-reference signal.

6. The integrated circuit of claim 1, wherein the second signal is a data-mask signal.

7. The integrated circuit of claim 1, wherein the transmit pads and the multi-modal pad are part of a signal bundle, the integrated circuit further comprising a plurality of additional signal bundles, each additional signal bundle including a respective additional plurality of transmit pads and a respective multi-modal pad.

8. The integrated circuit of claim 1, wherein the integrated circuit is a memory controller.

9. The integrated circuit of claim 1, wherein at least one of the data-communication circuits comprises a transmitter.

10. The integrated circuit of claim 1, wherein the integrated circuit is a memory device.

11. A memory system comprising:
    a. a memory controller having a plurality of first data ports, each of the first data ports including a first plurality of data pads and a multi-modal pad; and
    b. for each of the first data ports:
       a conductor bundle including a plurality of conductors, each conductor coupled to a respective one of the first plurality of data pads and the first multi-modal pad of the first data port; and
       a memory device having a second data port coupled to the first data port via the conductor bundle, the second data port including a second plurality of data pads coupled to corresponding ones of the first plurality of data pads and a reference pad coupled to the multi-modal pad.

12. The memory system of claim 11, wherein the memory controller conveys data signals to the memory devices via the first data ports.

13. The memory system of claim 11, wherein the memory controller provides a reference voltage for each memory device via the corresponding multi-modal and reference pads.

14. The memory system of claim 11, wherein the memory controller provides a timing reference for each memory device via the corresponding multi-modal and reference pads.

15. The memory system of claim 11, wherein each memory device includes a reference-voltage pad coupled to a reference-voltage source external to the memory devices and the memory controller.

16. A method comprising:
    connecting a plurality of first data pads on a memory controller to a corresponding plurality of second data pads on a memory device;
    connecting a multi-modal pad on one of the memory controller and the memory device to a corresponding reference pad on the other of the memory controller and the memory device; and
    configuring the one of the memory controller and the memory device that includes the multi-modal pad to apply one of a plurality of alternative signals to the multi-modal pad, wherein the alternative signals include a voltage reference.

17. The method of claim 16, wherein the alternative signals include at least one of a data-mask signal and a timing-reference signal.

18. The method of claim 16, further comprising communicating data between the memory control and the memory device via the first and second data pads.

19. The method of claim 18, wherein the data is communicating from the memory controller to the memory device.

20. An integrated circuit comprising:
   a. a plurality of pads, including data pads and a multi-modal pad;
   b. a plurality of communication circuits, each communicating circuit coupled to one of the data pads; and
   c. means for alternatively applying one of a reference voltage and a timing reference signal to the multi-modal pin.

21. The integrated circuit of claim 20, wherein the communication circuits compress transmitters.

22. A memory system comprising:
   a. a memory controller including a plurality of data pads, a multi-modal pad, and means for applying one of a reference voltage and a second signal to the multi-modal pad; and
   b. a memory device having a communication port coupled to the data and multi-modal pads.

23. The memory system of claim 22, wherein the second signal is a timing-reference signal.

24. A computer-readable medium having stored thereon a data structure defining an integrated circuit, the data structure comprising:
   a. first data representing a plurality of pads, including data pads and a multi-modal pad;
   b. second data representing a plurality of data-communication circuits, each data-communication circuit coupled to one of the data pads; and
   c. third data representing a reference source coupled to the multi-modal pad, the reference source operable in a reference-voltage mode to provide a reference-voltage signal on the multi-modal pad and in a second mode to provide a second signal on the multi-modal pad.

25. The integrated circuit of claim 24, wherein the second signal is a timing-reference signal.

26. A memory device comprising:
   a. a plurality of pads, including a reference voltage pad and a multi-modal pad; and
   b. a receiver having a voltage-reference input node selectively coupled to the reference voltage pad or the multi-modal pad.

27. The memory device of claim 26, further comprising a second multi-modal pad, wherein the voltage-reference input node of the receiver is selectively coupled to the second multi-modal pad.

28. The memory device of claim 26, further comprising a second receiver having a receiver input terminal coupled to the multi-modal pad and a second voltage-reference input node.

29. The memory device of claim 28, wherein the second voltage-reference input node is selectively coupled to the multi-modal pad.

30. The memory device of claim 28, wherein the second receiver is adapted to receive a data-mask signal.

31. The memory device of claim 26, further comprising a differential clock receiver having a first differential input terminal selectively coupled to the multi-modal pad and a second differential input terminal.

32. An integrated circuit comprising:
   a. a plurality of pads, including first and second timing-reference pads to receive respective complementary first and second timing-reference signals and a plurality of data pads to receive a plurality of data signals;
   b. a common-mode extraction circuit having a first extraction-circuit input node coupled to the first timing-reference pad, a second extraction-circuit input node coupled to the second timing-reference pad, and an extraction-circuit output node to convey a reference voltage derived from the complementary timing-reference signals;
   c. a timing-reference receiver having a timing-reference input node, coupled to the first timing-reference pad, and a clock-receiver output node; and
   d. a plurality of single-ended data receivers, each data receiver including a voltage-reference node coupled to the reference-circuit output node and a data node coupled to a respective one of the data pads.

33. The integrated circuit of claim 32, the extraction circuit further including a filter coupled between the extraction-circuit output node and a reference voltage.

34. The integrated circuit of claim 32, further comprising a reference pad, the extraction circuit further including a reference-voltage input terminal connected to the reference pad to receive an external reference voltage.

35. The integrated circuit of claim 34, the extraction circuit further including a multiplexer to selectively couple the reference-voltage input terminal to the extraction-circuit output node.

36. The integrated circuit of claim 35, further comprising a voltage divider extending between the first and second timing-reference pads and having a voltage-divider output node connected to the multiplexer, wherein the multiplexer selectively couples the voltage divider to the extraction-circuit output node.

37. The integrated circuit of claim 32, wherein the timing-reference signals are strobe signals.

38. The integrated circuit of claim 32, wherein the timing-reference receiver includes a second timing-reference input node coupled to the second timing-reference pad.

39. A system comprising:
   a. a first IC device having:
      i. a plurality of pads, including first and second timing-reference pads to convey respective complementary first and second timing-reference signals and a first plurality of data pads to convey a plurality of data signals;
      ii. a differential timing-reference transmitter having first and second differential timing-reference output nodes, coupled to the respective first and second timing-reference pads; and
      iii. a plurality of single-ended data transmitters, each data transmitters including a data node coupled to a respective one of the first plurality of data pads; and
   b. a second IC device having:
      i. a plurality of pads, including first and second timing-reference pads to receive the respective complementary first and second timing-reference signals and a second plurality of data pads to receive the plurality of data signals;
      ii. a common-mode extraction circuit having a first extraction-circuit input node coupled to the first timing-reference pad, a second extraction-circuit input node coupled to the second timing-reference pad, and an extraction-circuit output node to convey a reference voltage derived from the complementary timing-reference signals;
      iii. a timing-reference receiver having a timing-reference input node coupled to one of the first and second timing-reference pads, and a clock-receiver output node; and
      iv. a plurality of single-ended data receivers, each data receiver including a voltage-reference node coupled to the reference-circuit output node and a data node coupled to a respective one of the second plurality of data pads.

40. The system of claim 39, the extraction circuit further including a filter coupled between the extraction-circuit output node and a reference voltage.

41. The integrated circuit of claim 39, further comprising a reference pad, the extraction circuit further including a reference-voltage input terminal connected to the reference pad to receive an external reference voltage.

42. The integrated circuit of claim 41, the extraction circuit further including a multiplexer to selectively couple the reference-voltage input terminal to the extraction-circuit output node.

43. The integrated circuit of claim 42, further comprising a voltage divider extending between the first and second timing-reference pads and having a voltage-divider output node connected to the multiplexer, wherein the multiplexer selectively couples the voltage divider to the extraction-circuit output node.

44. The integrated circuit of claim 39, wherein the timing-reference signals are strobe signals.

45. A method comprising:
   a. receiving a differential timing-reference signal;
   b. receiving a single-ended data signal;
   c. extracting a common-mode voltage and a reference timing signal from the differential timing-reference signal; and
   d. sampling the single-ended data signal using the common-mode voltage and the reference timing signal.

46. The method of claim 45, further comprising filtering the common-mode voltage.

47. A method comprising:
   a. receiving a differential timing-reference signal;
   b. providing a common-mode extraction circuit to extract a common-mode voltage from the timing-reference signal;
   c. selecting between a reference voltage and the common-mode voltage;
   d. receiving a single-ended data signal;
   e. extracting a reference timing signal from the differential timing-reference signal; and
   f. sampling the single-ended data signal using the reference timing signal and the selected one of the reference voltage and the common-mode voltage.

48. The method of claim 47, further comprising filtering the common-mode voltage.

49. An integrated circuit comprising:
   a. a plurality of pads, including first and second timing-reference pads to receive respective complementary first and second timing-reference signals and a plurality of data pads to receive a plurality of data signals;
   b. means for extracting a common-mode voltage from the timing-reference signal;
   c. means for recovering a third timing-reference signal from the complementary first and second timing-reference signals;
   d. a plurality of data receivers, each data receiver including a voltage-reference node to receive the common-mode voltage and a clock node to receive the third timing reference signal.

50. The integrated circuit of claim 49, further comprising means for filtering the common-mode voltage.

51. The integrated circuit of claim 49, further comprising means for selecting between the common-mode voltage and a reference voltage.

52. The integrated circuit of claim 51, further comprising a reference-voltage pad to receive the reference voltage from an external reference source.

53. A computer-readable medium having stored thereon a data structure defining an integrated circuit, the data structure comprising:
   a. first data representing a plurality of pads, including first and second timing-reference pads to receive respective complementary first and second timing-reference signals and a plurality of data pads to receive a plurality of data signals;
   b. second data representing a common-mode extraction circuit having a first extraction-circuit input node coupled to the first timing-reference pad, a second extraction-circuit input node coupled to the second timing-reference pad, and an extraction-circuit output node to convey a reference voltage derived from the complementary timing-reference signals;
   c. third data representing a differential timing-reference receiver having first and second differential timing-reference input nodes, coupled to the respective first and second timing-reference pads, and a clock-receiver output node; and
   d. fourth data representing a plurality of single-ended data receivers, each data receiver including a voltage-reference node coupled to the reference-circuit output node and a data node coupled to a respective one of the data pads.

54. The medium of claim 53, further comprising fifth data representing a reference pad, the second data further representing a reference-voltage input terminal connected to the reference pad to receive an external reference voltage.

55. The medium of claim 54, wherein the common-mode extraction circuit is to select between the external reference voltage and the reference voltage derived from the complementary timing-reference signals.

* * * * *